(12) United States Patent
Hur (10) Patent No.: US 7,880,169 B2
(45) Date of Patent: Feb. 1, 2011

(54) DISPLAY APPARATUS AND MANUFACTURING METHOD THEREOF

(75) Inventor: Myung-Koo Hur, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 14 days.

(21) Appl. No.: 12/348,790

(22) Filed: Jan. 5, 2009

(65) Prior Publication Data

US 2010/0171123 A1 Jul. 8, 2010

(51) Int. Cl.
*H01L 31/036* (2006.01)

(52) U.S. Cl. .............................. 257/59; 257/72; 257/83; 257/257; 257/290; 257/368; 257/E31.053

(58) Field of Classification Search ................. 257/290, 257/298, 306, 443, 499, 59, 72, 83, 257, 257/368

See application file for complete search history.

(56) References Cited

U.S. PATENT DOCUMENTS 6,887,742 B2 * 5/2005 Baek et al. ................. 438/149

2008/0213950 A1 * 9/2008 Moon ......................... 438/157
2009/0091676 A1 * 4/2009 Takeuchi et al. ............. 349/43
2009/0261338 A1 * 10/2009 Tsubata et al. ............... 257/72

* cited by examiner

*Primary Examiner*—Wai-Sing Louie
(74) *Attorney, Agent, or Firm*—Innovation Counsel LLP (57) ABSTRACT

A display apparatus includes a gate electrode, a first insulating layer pattern formed over the gate electrode, a second insulating layer pattern formed over the first insulating layer pattern, exposing a portion of the first insulating layer, a semiconductor film pattern formed over the second insulating layer pattern and over the first insulating layer pattern, an impurity-doped semiconductor film pattern formed on the semiconductor film pattern, wherein the impurity-doped semiconductor film pattern contacts the top surface of the semiconductor film pattern and exposes a portion of the semiconductor film pattern formed over the gate electrode, a source electrode and a drain electrode each formed over a portion of the impurity doped semiconductor film pattern, a protection film pattern formed over the source electrode and the drain electrode in a TFT area, the protection film pattern having a contact hole over the drain electrode, a pixel electrode pattern formed on the protection film pattern and_electrically connected to the drain electrode.

14 Claims, 8 Drawing Sheets

DISPLAY APPARATUS AND MANUFACTURING METHOD THEREOF

BACKGROUND OF THE INVENTION

1. Field of the Invention

The present invention relates to a display apparatus and more particularly, to a display apparatus having substantially reduced power consumption.

2. Description of the Related Art

In general, liquid crystal displays are widely used as an alternative to cathode ray tubes for image display devices. A liquid crystal display includes two substrates spaced apart from each other at a predetermined distance and a layer of liquid crystals disposed therebetween. In a liquid crystal display, an electric field is applied to the liquid crystals to control the intensity of the electric field between the two substrates to adjust the amount of light passing through to display a desired image.

Aperture ratio is a very important factor in LCD technology. Improved aperture ratio increases the data line load which also affects power consumption. High power consumption affects driving margin and heat generation which are very important to customers.

BRIEF SUMMARY OF THE INVENTION

The present invention provides a display apparatus having substantially reduced power consumption and a high aperture ratio.

In one embodiment of the present invention, a display apparatus includes a gate electrode, a first insulating layer pattern formed over the gate electrode, a second insulating layer pattern formed over the first insulating layer pattern, exposing a portion of the first insulating layer, a semiconductor film pattern formed over the second insulating layer pattern and over the first insulating layer pattern, an impurity-doped semiconductor film pattern formed on the semiconductor film pattern, wherein the impurity-doped semiconductor film pattern contacts the top surface of the semiconductor film pattern and exposes a portion of the semiconductor film pattern formed over the gate electrode, a source electrode and a drain electrode each formed over a portion of the impurity doped semiconductor film pattern, a protection film pattern formed over the source electrode and the drain electrode in a TFT area, the protection film pattern having a contact hole over the drain electrode, a pixel electrode pattern formed on the protection film pattern and_electrically connected to the drain electrode.

In another embodiment of the present invention, a display apparatus includes a gate electrode, a first insulating layer pattern formed over the gate electrode, exposing a portion of the gate electrode, a second insulating layer pattern formed over the first insulating layer pattern, a semiconductor film pattern formed over the first insulating layer pattern and over the second insulating layer pattern, an impurity-doped semiconductor film pattern formed on the semiconductor film pattern, wherein the impurity doped semiconductor film pattern contacts the top surface of the semiconductor film pattern and exposes a portion of the semiconductor film pattern formed over the gate electrode, a source electrode and a drain electrode formed over a portion of the impurity-doped semiconductor film pattern, a protection film pattern formed over the source electrode and the drain electrode in a TFT area, the protection film pattern having a contact hole over the drain electrode, a pixel electrode pattern formed on the protection film pattern and_electrically connected to the drain electrode.

In an alternate embodiment of the present invention, a manufacturing method of the display apparatus includes, forming a first metal layer on a substrate, patterning the first metal layer to provide a gate electrode, forming a first insulating layer on the gate electrode, forming a second insulating layer on the gate electrode, patterning the second insulating layer and exposing a portion of the first insulating layer, forming a patterned semiconductor layer on the first insulating layer and the second insulating layer, forming a patterned third metal layer on the patterned semiconductor layer opposite the second insulating layer, forming a protection film on the substrate on which the patterned semiconductor layer and the patterned third metal layer are formed, patterning the protection film, to expose the patterned third metal layer, forming a pixel electrode on the substrate on which the protection film and the patterned third metal layer are formed.

In another embodiment of the present invention, a manufacturing method of the display apparatus includes, forming a first metal layer on a substrate, patterning the first metal layer to provide a gate electrode, forming a first insulating layer on the gate electrode; patterning the first insulating layer and exposing a portion of the first metal layer; forming a second insulating layer on the gate electrode and the first insulating layer, forming a patterned semiconductor layer on the second insulating layer, forming a patterned third metal layer on the patterned semiconductor layer opposite the first insulating layer, forming a protection film on the substrate on which the patterned semiconductor layer and the patterned third metal layer are formed, patterning the protection film, exposing the patterned third metal layer, forming a pixel electrode on the substrate on which the protection film and the patterned third metal layer are formed.

BRIEF DESCRIPTION OF THE DRAWINGS

The above and other aspects, features, and advantages of the present invention will become more readily apparent from the detailed descriptions of the exemplary embodiments with reference to the accompanying drawings, in which.

DETAILED DESCRIPTION OF THE INVENTION

The invention is described more fully hereinafter with reference to the accompanying drawings, in which exemplary embodiments of the invention are shown. The present invention may, however, be embodied in many different forms and should not be construed as being limited to the embodiments set forth herein. Rather, these embodiments are provided so that this disclosure is thorough and complete, and fully conveys the scope of the invention to those skilled in the art. Like reference numerals refer to like elements throughout.

It is understood that when an element is referred to as being "on" another element, it can be directly on the other element or intervening elements may be present therebetween. In contrast, when an element is referred to as being "directly on" another element, there are no intervening elements present.

As used herein, the term "and/or" includes any and all combinations of one or more of the associated listed items.

It is understood that although the terms "first," "second," "third" etc. may be used herein to describe various elements, components, regions, layers and/or sections, these elements, components, regions, layers and/or sections are not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It is further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the FIGS. It is understood that relative terms are intended to encompass different orientations of the device in addition to the orientation depicted in the FIGS. For example, if the device in one of the FIGS is turned over, elements described as being on the "lower" side of other elements would then be oriented on the "upper" side of the other elements. The exemplary term "lower" can, therefore, encompass both an orientation of "lower" and "upper," depending upon the particular orientation of the FIG. Similarly, if the device in one of the FIGS. were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It is further understood that terms, such as those defined in commonly used dictionaries, should be interpreted as having a meaning which is consistent with their meaning in the context of the relevant art and the present disclosure, and is not to be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the FIGS. are schematic in nature and their shapes are not intended to illustrate the precise shape of a region and are not intended to limit the scope of the present invention. Hereinafter, exemplary embodiments of the present invention are explained in further detail with reference to the accompanying drawings.

Figure 1:
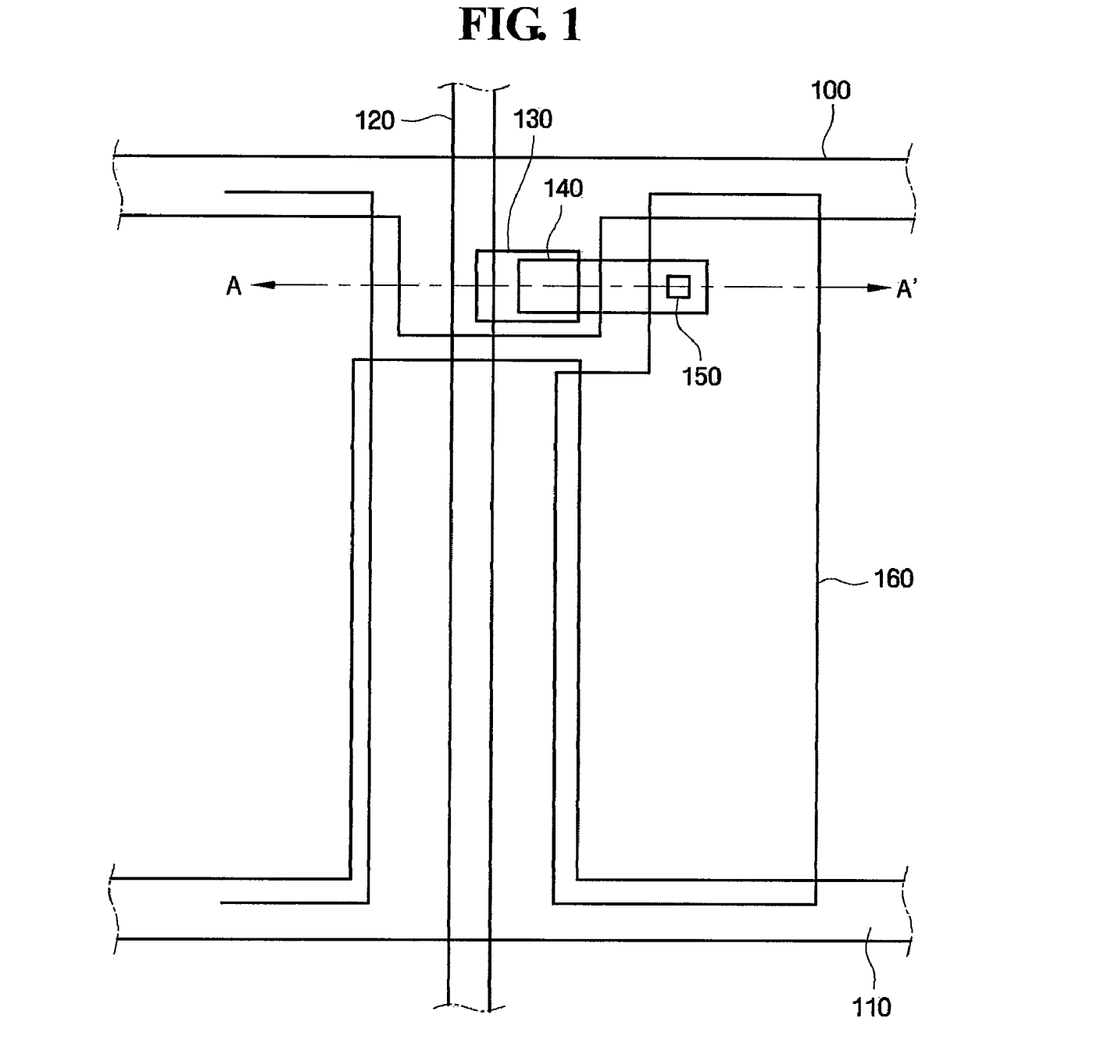
FIG. 1 is a schematic plan view of one embodiment of the present invention.

FIG. 1 is a schematic plan view of one embodiment of the present invention. Reference numeral 100 denotes a gate line; reference numeral 110 denotes a storage line; reference numeral 120 denotes a data line; reference numeral 130 denotes a source electrode/drain electrode; reference numeral 140 denotes a semiconductor film; reference numeral 150 denotes a contact hole for connecting a pixel electrode to the drain electrode in the TFT area; and reference numeral 160 denotes a pixel electrode in the TFT area.

Referring to FIG. 1, the gate line 100 is arranged horizontally, and the data line 120 is arranged to be perpendicular to the gate line. A plurality of gate lines 100 and data lines 120 in a display device are arranged in a matrix pattern. The storage lines 110 in a display device are arranged horizontally and vertically. The storage line 110 is separated from the gate line 100. A protrusion of the storage line 110 overlaps data line 120. The storage line 110 is located between two gate lines 100. Pixels are arranged in a matrix pattern, each in an area bounded by two adjacent gate lines and data lines. The gate electrode of each TFT is formed to protrude into the respective pixel region from the respective gate line 100. A semiconductor film 140 is formed between the drain electrodes and the gate electrodes of each TFT The source electrodes of the TFTs are formed in protruding portions from the data line 120. A pixel electrode 150 includes a transparent ITO and is formed in the respective pixel region. A portion of the pixel electrode 150 overlaps storage line 110.

FIG. 2-8 are cross-sectional views showing a method for manufacturing a liquid crystal display according to one embodiment of the present invention. Each FIG. is a cross-sectional view taken along A-A' of FIG. 1.

Figure 2:
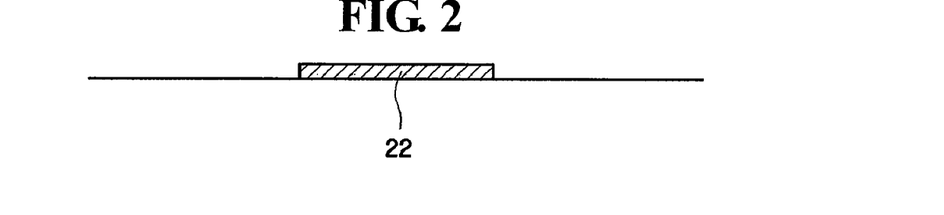
FIGS. 2-8 are cross-sectional views showing the steps for forming a first exemplary embodiment.

FIG. 2 shows the forming of the gate electrode, in which a metal film 22 is formed by depositing a conductive metal on a substrate. The metal film 22 may have one or more layers. For example, the metal film 22 may include a first metal film formed by depositing an Al or an Al-alloy film with a thickness of 2000-4000 angstroms over a transparent substrate. The metal film 22 may include a second metal film formed by depositing a refractory metal film to a thickness of 500-2000 angstroms over the first metal film. A gate pattern 22 is then formed in the TFT area and the pad area by performing a first photolithography on metal film 22 through wet or dry etching using a mask. The resulting gate patterns 22 are used as a gate electrode in the TFT area.

The first metal film is preferably formed of Al or an Al alloy such as Al—Nd or Al—Ta. It is possible to lower the resistance of the gate line and prevent hillock formation when the gate electrode is formed of an Al alloy. The second metal film is preferably formed of a refractory metal selected from the group consisting of Cr, Ta, Mo, and Ti. The second metal film acts as a capping film to prevent the Al alloy from contacting a ITO film formed in a subsequent process. Because a capping film is formed on the Al or Al-alloy, high temperature oxidation and photolithography processes for forming an oxidized film are not required. Even though the second metal film directly contacts the ITO film formed in a subsequent process, no battery effect is generated, since the second metal film does not include Al.

Figure 3:
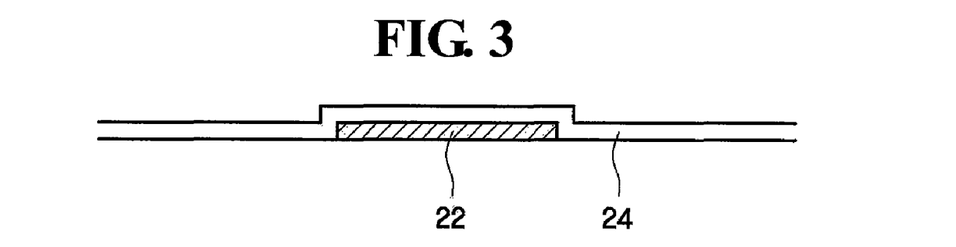

FIG. 3 shows the forming of a first insulator pattern 24. The first insulator pattern 24 is formed by depositing a nitride film with a thickness of about 4000 angstroms over the entire surface of the substrate on which a gate pattern 22 is formed.

Figure 4:
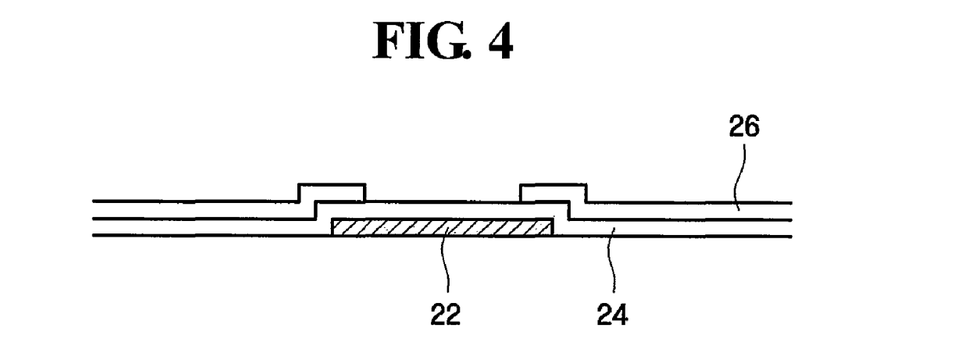

FIG. 4 shows the forming of a second insulator pattern 26. The second insulator film is formed by depositing a film which includes a material different from the first insulator pattern 24. The second pattern 26 is then formed in the TFT area by performing a second photolithography on the second insulator film. By conducting a second photolithography, the second insulator pattern 26 is made to only partially overlap the gate electrode 22.

Figure 5:
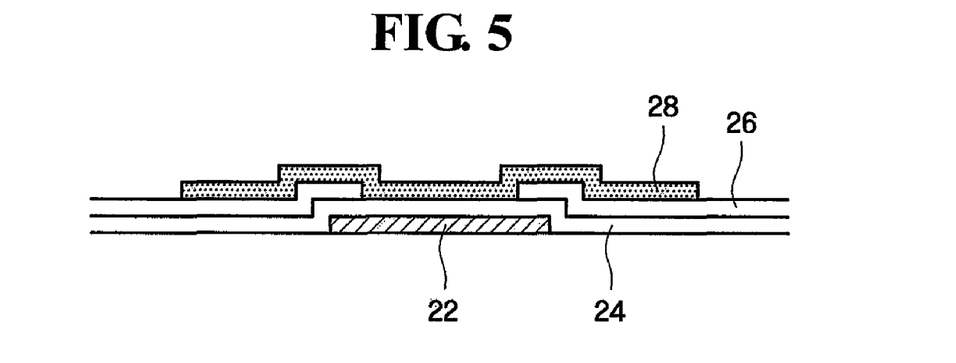

FIG. 5 shows the forming of a semiconductor film pattern 28. The semiconductor film in one embodiment of the invention includes an amorphous silicon film and an impurity-doped amorphous silicon film which are formed with a thickness of 1000-2000 angstrom and 500 angstrom, respectively, on the first insulator pattern 24 and the second insulator pattern 26. The semiconductor film pattern 28 to be used as an active area is formed in the TFT area by performing a third photolithography on the semiconductor film.

Figure 6:
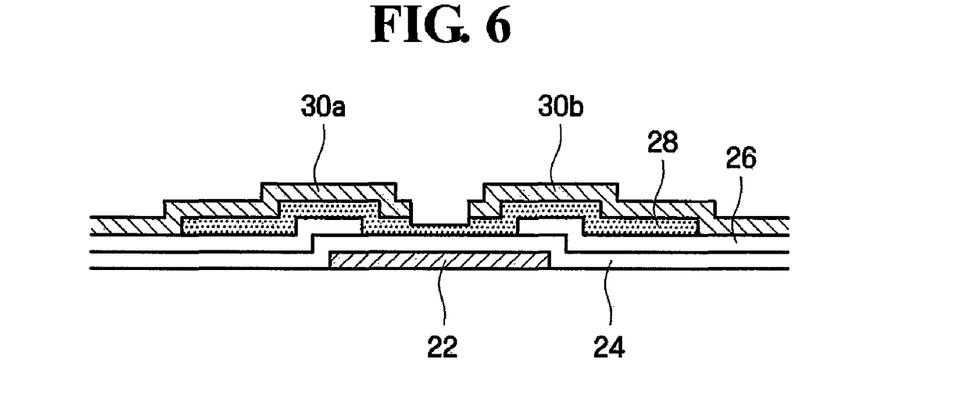

FIG. 6 shows the forming of a source electrode 30a and a drain electrode 30b. A third metal film (which eventually forms source and drain electrodes 30a and 30b) is formed by depositing a Cr film with a thickness of 1000-2000 angstroms over the entire surface of the substrate on which the semiconductor film pattern is formed. The third metal film is preferably deposited using a sputtering method. The source electrode 30a and the drain electrode 30b are then formed by performing a fourth photolithography on the third metal film.

The impurity-doped amorphous silicon film located between the source electrode 30a and the drain electrode 30b is patterned along with the metal film.

Figure 7:
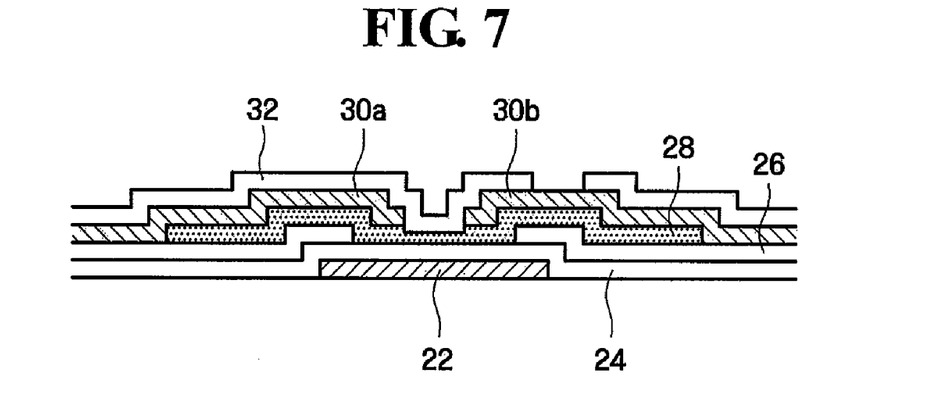

FIG. 7 shows the forming of a protection film pattern 32. The protection film is formed by depositing an insulating material, e.g., an oxide film, with a thickness of 1000-3000 angstroms, over the entire surface of the substrate on which the source electrode 30a and the drain electrode 30b are formed. A protection film pattern 32 is formed by performing a fifth photolithography on the protection film. The protection film pattern 32 exposes a portion of the drain electrode 30b.

Figure 8:
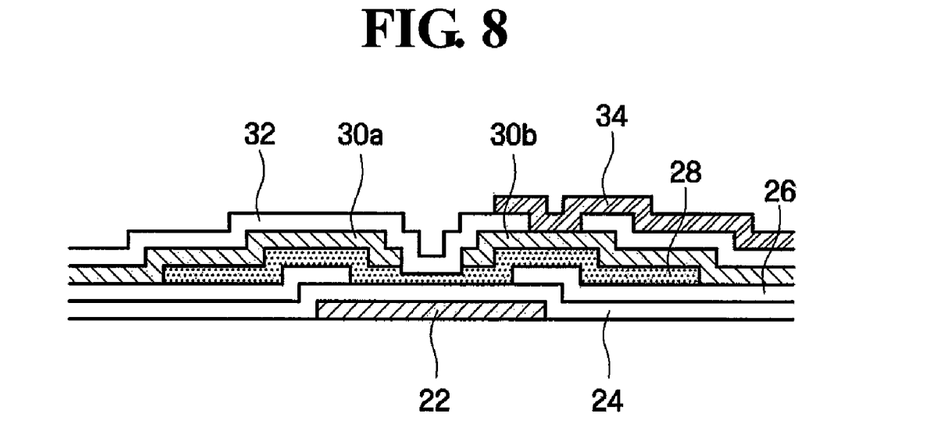

FIG. 8 shows the forming of a pixel electrode. A transparent conductive ITO film is formed by a sputtering method over the entire surface of the substrate on which the protection film pattern 32 is formed. The pixel electrode 34 is formed by performing a sixth photolithography on the ITO film.

FIGS. 9-15 are cross-sectional views showing a method for manufacturing a liquid crystal display according to a second embodiment of the present invention.

Figure 9:
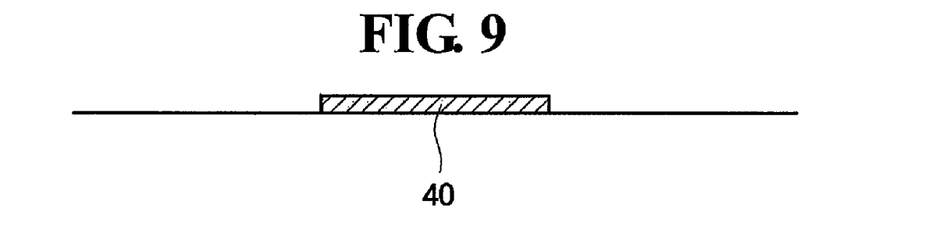
FIGS. 9-15 are cross-sectional views showing the steps for forming a second exemplary embodiment.

FIG. 9 shows the forming of a gate electrode, in which a metal film 42 is formed by depositing a conductive metal. The metal film 40 has at least one layer. For example, the metal film 40 may include a first metal film formed by depositing an Al or an Al-alloy film with a thickness of 2000-4000 angstroms over a transparent substrate. The metal film 40 has a second metal film formed by depositing a refractory metal film with a thickness of 500-2000 angstroms over the first metal film. Gate patterns are then formed in the TFT area by performing a first photolithography on the metal film 40. The gate pattern 40 is used as a gate electrode in the TFT area. The metal film 40 can be wet or dry etched using a mask. The first metal film is preferably formed of Al or an Al alloy such as Al—Nd or Al—Ta. It is possible to lower the resistance of the gate line and prevent hillock formation when the gate electrode is formed of an Al alloy. The second metal film is preferably formed of a refractory metal selected from the group consisting of Cr, Ta, Mo, and Ti. The second metal film acts as a capping film to prevent the Al alloy from contacting an ITO film formed in a subsequent process. Because the capping film is formed on an Al or an Al-alloy, high temperature oxidation and photolithography processes for forming an oxidized film are not required. Even though the second metal film directly contacts the ITO film formed in a subsequent process no battery effect is generated because the second metal film does not include Al.

Figure 10:
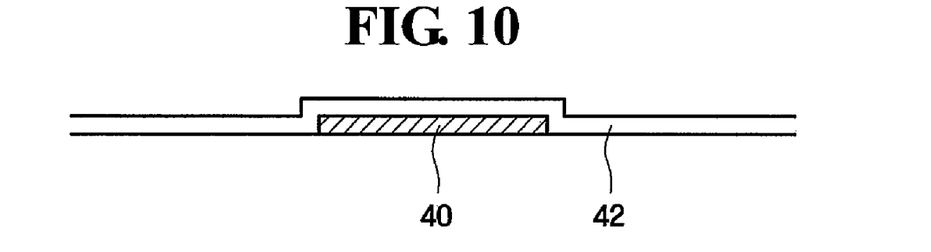

FIG. 10 shows the forming of a first insulator pattern 42. A nitride film with a thickness of about 4000 angstroms is deposited over the entire surface of the substrate on which the gate pattern 40 is formed.

Figure 11:
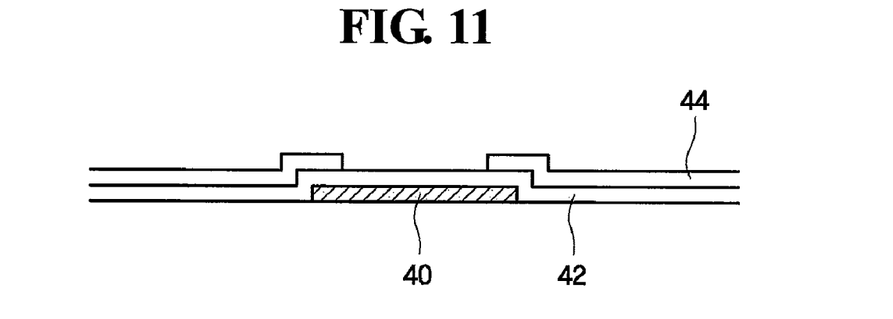

FIG. 11 shows the forming of a second insulator pattern 44. A second insulator layer is formed by depositing a film which includes a material different from that of the first insulator pattern 42. The second insulator pattern 44 is then formed in the TFT area by performing a second photolithography on the second insulator layer. The second photolithography is performed in such a way that only a portion of the second insulator pattern 44 overlaps the gate electrode 40.

Figure 12:
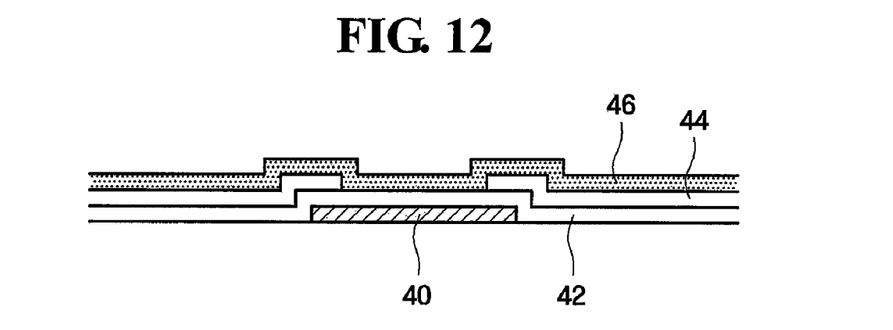

FIG. 12 shows the forming of a semiconductor film pattern 46. The semiconductor film 46 preferably has an amorphous silicon film and an impurity-doped amorphous silicon film formed with thicknesses of 1000-2000 and 500 angstroms, respectively, on the first insulator pattern 42 and the second insulator pattern 44.

Figure 13:
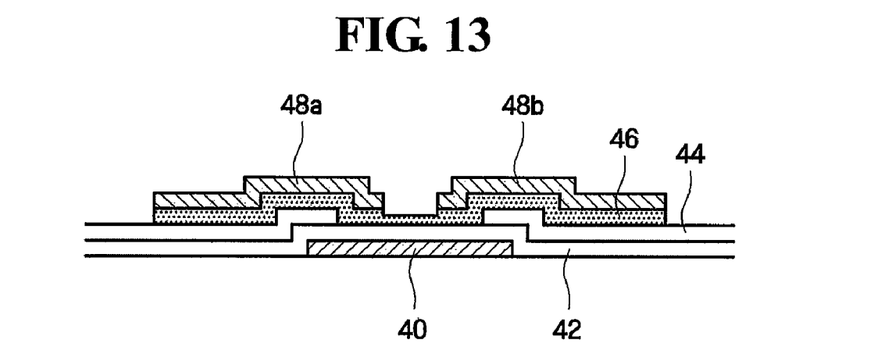

FIG. 13 shows the forming of a source electrode 48a and a drain electrode 48b. A third metal film (which eventually forms the source and drain electrodes 4Ba and 48b) is formed by depositing a Cr film with a thickness of 1000-2000 angstroms over the entire surface of the substrate on which the semiconductor film pattern 46 is formed. The third metal film is preferably deposited using a sputtering method.

The third metal film is patterned by performing a third photolithography. The third photolithography uses slit mask. Use of a slit mask in photolithography is well known to those skilled in the art thus, detailed description is omitted.

Semiconductor film 46 is also patterned by the third photolithography process. Namely, the third metal film and the semiconductor film 46 are patterned sequentially by one photolithography process.

The impurity-doped amorphous silicon film located between the source electrode 48a and the drain electrode 48b is also patterned when the third metal film 48a and 48b is patterned.

Figure 14:
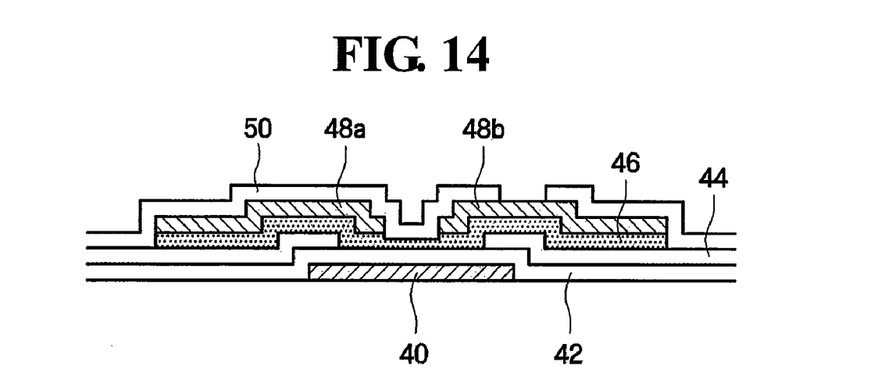

FIG. 14 shows the forming of a protection film pattern 50. The protection film 50 is formed by depositing an insulating material, e.g., an oxide film, with a thickness of 1000-3000 angstroms over the entire surface of the substrate on which the source electrode 48a and the drain electrode 48b are formed. The protection film pattern 50 is formed by performing a fourth photolithography on the protection film layer. The protection film pattern 50 exposes a portion of the drain electrode 48b.

Figure 15:
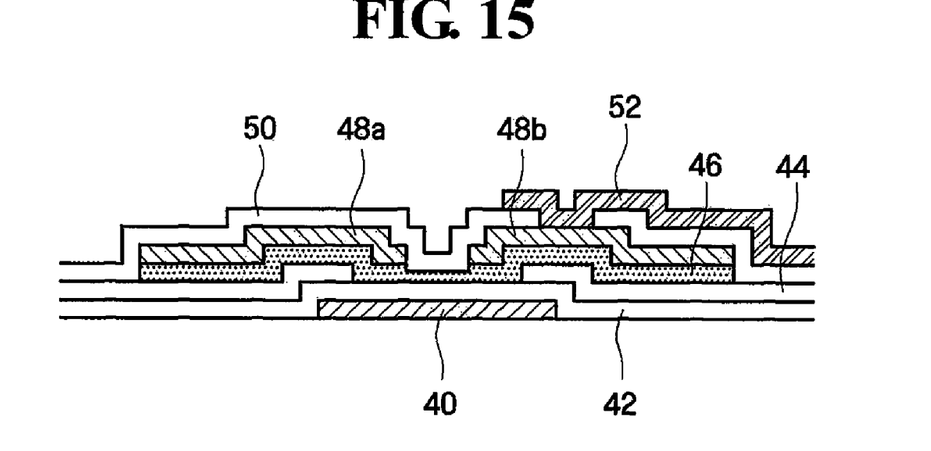

FIG. 15 shows the forming of a pixel electrode 52. A transparent conductive ITO film 52 is formed by a sputtering method over the entire surface of the substrate on which the protection film pattern 50 is formed. The pixel electrode 52 is formed by performing a sixth photolithography on the ITO film layer.

FIG. 16-22 are cross-sectional views showing a method for manufacturing a liquid crystal display according to a third embodiment of the present invention.

Figure 16:
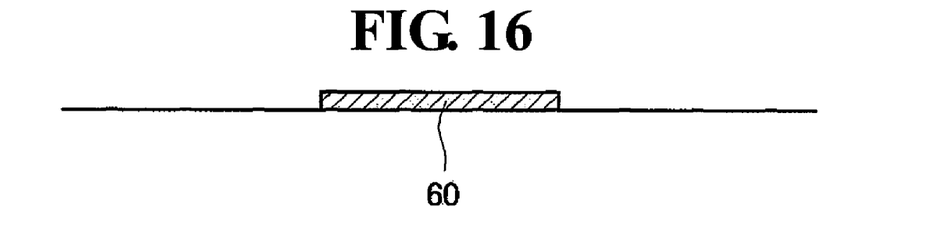
FIGS. 16-22 are cross-sectional views showing the steps for forming a third exemplary embodiment.

FIG. 16 shows the forming of a gate electrode 60. A metal film 60 is formed by depositing a conductive metal on a substrate. The metal film 60 has at least one layer. For example, the metal film may have a first metal film formed by depositing an Al or an Al-alloy film with a thickness of 2000-4000 angstroms over a transparent substrate. The metal film 60 may have a second metal film formed by depositing a refractory metal film with a thickness of 500-2000 angstroms over the first metal film. Gate pattern 60 is then formed in a TFT area by performing a first photolithography on the metal film 60. The gate pattern 60 is used as a gate electrode in the TFT area. The metal film 22 may be wet or dry etched using a mask.

The first metal film is preferably formed of Al or an Al alloy such as Al—Nd or Al—Ta. It is possible to lower the resistance of the gate line and prevent hillock formation when the gate electrode is formed with an Al alloy. The second metal film is preferably formed of a refractory metal selected from the group consisting of Cr, Ta, Mo, and Ti. The second metal film acts as a capping film to prevent the Al alloy from contacting an ITO film formed in a subsequent process. Because the capping film is formed on Al or Al-alloy, high temperature oxidation and photolithography processes for forming an oxidized film are not required. Even though the second metal film directly contacts the ITO film formed in a subsequent process, since the second metal film does not include Al, no battery effect is generated.

Figure 17:
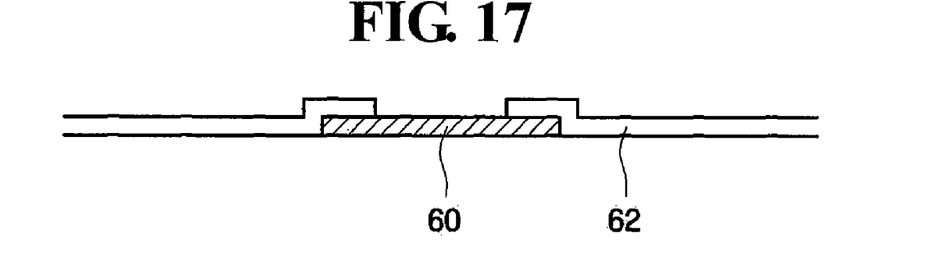

FIG. 17 shows the forming of a first insulator pattern 62. The first insulator pattern 62 is formed by depositing an insulation film. The first insulator pattern 62 is then formed in a TFT area by performing a first photolithography on the first insulator film. The first insulator pattern 62 partially overlaps the gate electrode 60.

Figure 18:
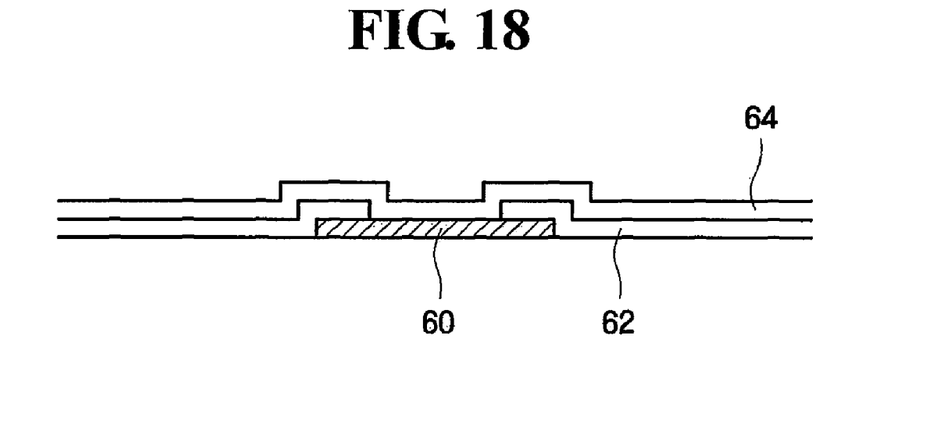

FIG. 18 shows the forming of a second insulator pattern 64. The second insulator pattern 64 is formed by depositing a nitride film to a thickness of about 4000 angstroms over the entire surface of the substrate on which a gate pattern 60 and the first insulator pattern 62 are formed.

Figure 19:
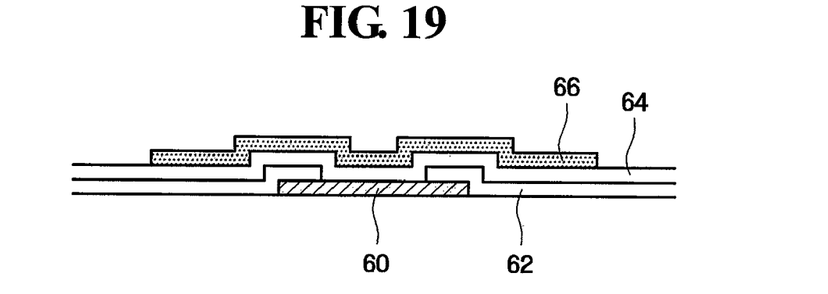

FIG. 19 shows the forming of a semiconductor film pattern 66. A semiconductor film 66 in one embodiment of the invention includes an amorphous silicon film and an impurity-doped amorphous silicon film formed with thicknesses of 1000-2000 and 500 angstroms, respectively, on the first insulating pattern 62 and the second insulator pattern 64. A semiconductor film pattern 66 to be used as an active area is formed in the TFT area by performing a third photolithography on the semiconductor film 66.

Figure 20:
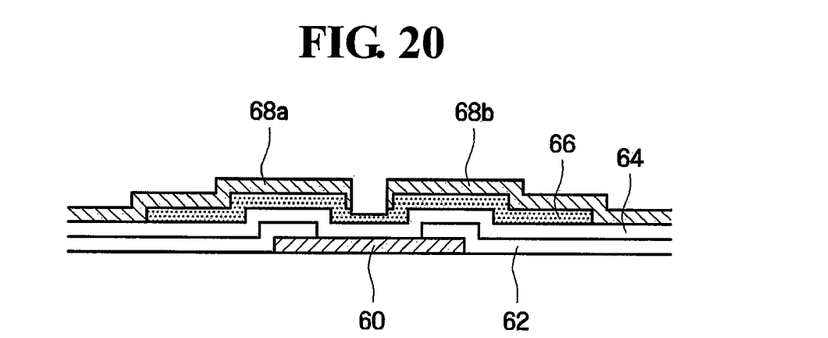

FIG. 20 shows the forming of a source electrode 68a and a drain electrode 68b. A third metal film 68a and 68b is formed by depositing a Cr film with a thickness of 1000-2000 angstroms over the entire surface of the substrate on which the semiconductor film pattern 66 is formed. The third metal film 68a and 68b is preferably deposited using a sputtering method. The source electrode 68a and the drain electrode 68b are then formed by performing a fourth photolithography on the third metal film 68a and 68b.

The impurity-doped amorphous silicon film located between a source electrode 68a and a drain electrode 68b is patterned along with the metal film 68a and 68b.

Figure 21:
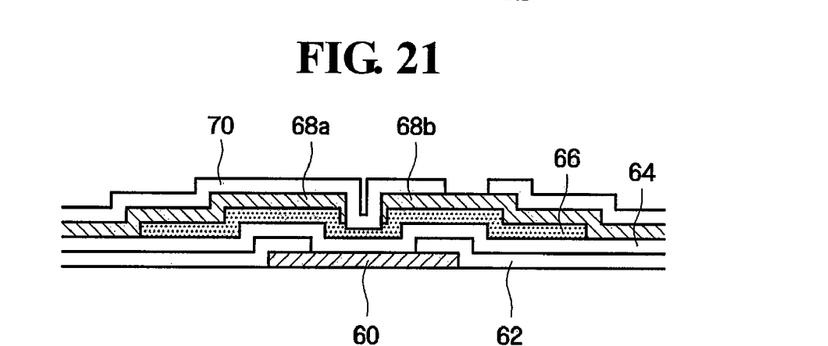

FIG. 21 shows the steps for forming a protection film pattern 70. A protection film 70 is formed by depositing an insulating material, e.g., an oxide film with a thickness of 1000-3000 angstrom over the entire surface of the substrate on which the source electrode 68a and the drain electrode 68b are formed. A protection film pattern 70 is formed by performing a fourth photolithography on the protection film 70. The protection film pattern 70 exposes a portion of the drain electrode 68b.

Figure 22:
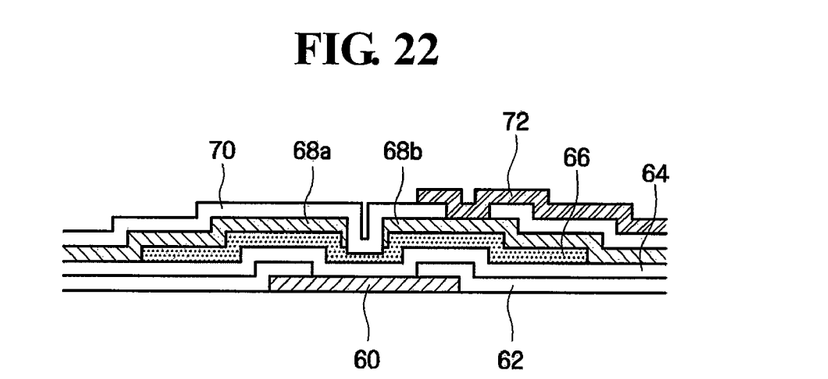

FIG. 22 shows the forming of a pixel electrode 72. A transparent conductive ITO film is formed by a sputtering method over the entire surface of the substrate on which the protection film pattern 70 is formed. The pixel electrode 72 is formed by performing a sixth photolithography on the ITO film.

FIGS. 23-29 are cross-sectional views showing a method for manufacturing a liquid crystal display according to a fourth embodiment of the present invention.

Figure 23:
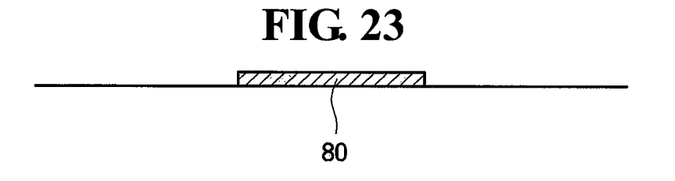
FIGS. 23-29 are cross-sectional views showing the steps for forming a fourth exemplary embodiment.

FIG. 23 shows the forming of the gate electrode 80. A metal film 80 is formed by depositing a conductive metal. The metal film 80 has at least one layer. For example, the metal film may include a first metal film formed by depositing an Al or an Al-alloy film with a thickness of 2000-4000 angstroms over a transparent substrate. The metal film 80 may further include a second metal film formed by depositing a refractory metal film with a thickness of 500-2000 angstroms over the first metal film. The gate pattern is then formed in a TFT area and a pad area by performing a first photolithography on the metal film 80. The gate pattern is used as the gate electrode 80 in the TFT area. The metal film 80 can be wet or dry etched using a mask.

The first metal film is preferably formed of Al or an Al alloy such as Al—Nd or Al—Ta. It is possible to lower the resistance of the gate line and prevent hillock formation when the gate electrode is formed of an Al alloy. The second metal film is preferably formed of a refractory metal selected from the group consisting of Cr, Ta, Mo, and Ti. The second metal film acts as a capping film to prevent the Al alloy from contacting an ITO film formed in a subsequent process. Because a capping film is formed on Al or Al-alloy, high temperature oxidation process and photolithography processes for forming an oxidized film are not required. Even though the second metal film directly contacts the ITO film formed in a subsequent process, since the second metal film does not include Al, no battery effect is generated.

Figure 24:
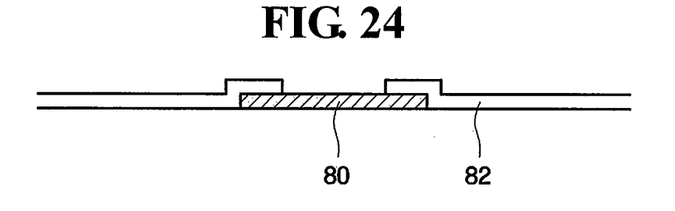

FIG. 24 shows the forming of a first insulator pattern 82. The first insulator pattern 82 is formed by depositing an insulating film. The first insulator pattern 82 is then formed in the TFT area by performing a first photolithography on the first insulating film 82. The gate electrode 80 partially overlaps the first insulator 82.

Figure 25:
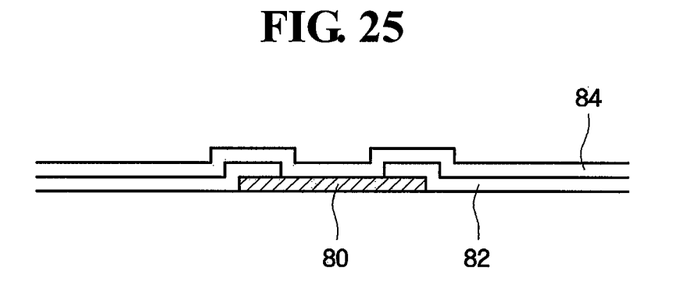

FIG. 25 shows the forming of a second insulator pattern 84. The second insulator pattern 84 is formed by depositing a nitride film with a thickness of about 4000 angstroms over the entire surface of the substrate on which a gate pattern 80 and the first insulator pattern 82 are formed.

Figure 26:
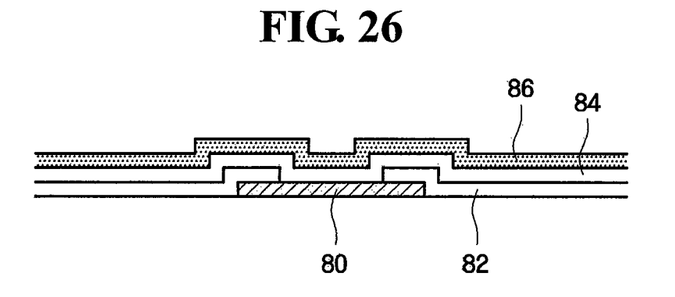

FIG. 26 shows the forming of a semiconductor film pattern. A semiconductor film 86, preferably includes an amorphous silicon film and an impurity-doped amorphous silicon film, is formed with thicknesses of 1000-2000 and 500 angstroms, respectively, on the first insulator pattern 82 and second insulator pattern 84.

Figure 27:
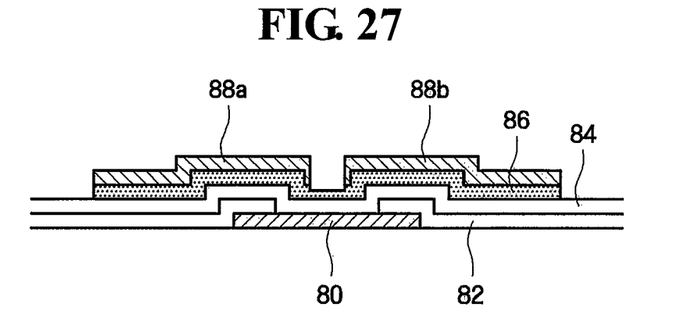

FIG. 27 shows the forming of a source electrode 88a and a drain electrode 88b. A third metal film 88a and 88b is formed by depositing a Cr film with a thickness of 1000-2000 angstroms over the entire surface of the substrate on which the semiconductor film pattern 86 is formed. The third metal film 88a and 88b is preferably deposited using a sputtering method.

The third metal film 88a and 88b is patterned by performing a third photolithography. The third photolithography uses a slit mask. The use of a slit mask in photolithography is well known to those skilled in the art and thus detailed description is omitted.

The semiconductor film 86 is also patterned by the third photolithography process. Namely, the third metal film 88a and 88b and the semiconductor film 86 is patterned sequentially by one photolithography process.

The impurity-doped amorphous silicon film located between the source electrode 88a and the drain electrode 88b is patterned along with the third metal film 88a and 88b.

Figure 28:
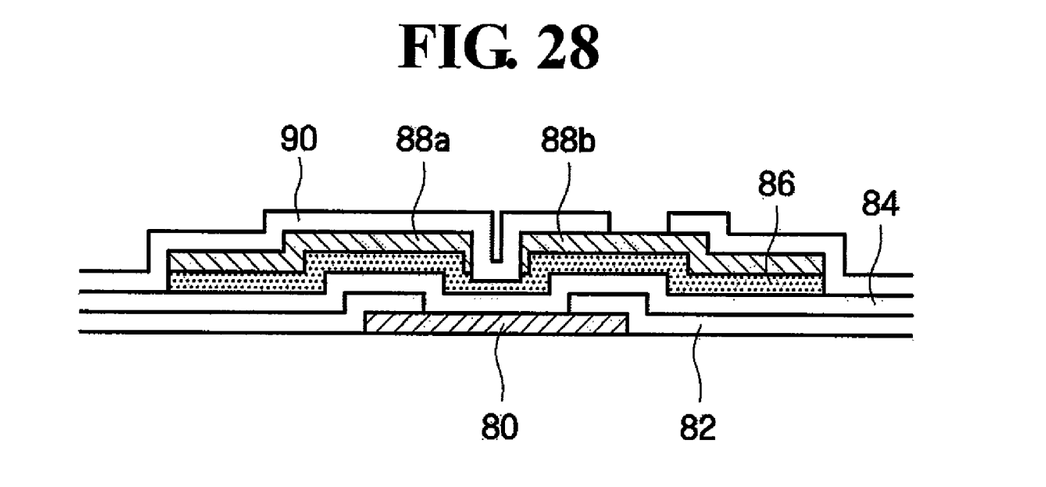

FIG. 28 shows the forming of a protection film pattern 90. A protection film 90 is formed by depositing an insulating material, e.g., an oxide film, with a thickness of 1000-3000 angstrom over the entire surface of the substrate on which the source electrode 88a and the drain electrode 88b are formed. The protection film pattern 90 is formed by performing a fourth photolithography on the protection film 90. The protection film pattern 90 exposes a portion of the drain electrode 88b.

Figure 29:
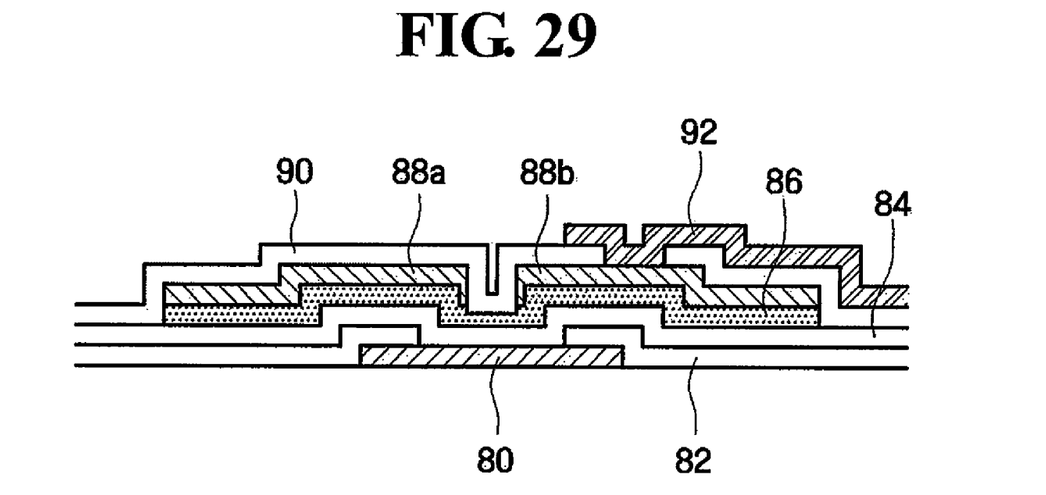

FIG. 29 shows the forming of a pixel electrode 92. A transparent conductive ITO film 92 is formed by a sputtering method over the entire surface of the substrate on which the protection film pattern 90 is formed. The pixel electrode 92 is formed by performing a sixth photolithography on the ITO film.

As described herein, a display apparatus and manufacturing method thereof according to an exemplary embodiment of the present invention are presented. One advantage of embodiments of the invention is that power consumption is substantially reduced.

The present invention should not be construed as being limited to the exemplary embodiments set forth herein. Rather, these exemplary embodiments are provided so that this disclosure is thorough and complete and fully conveys the concept of the present invention to those skilled in the art.

What is claimed is:

1. A display apparatus, comprising:
a gate electrode;
a first insulating layer pattern formed over the gate electrode;
a second insulating layer pattern formed over the first insulating layer pattern and having a gap positioned over the gate electrode, there being no second insulating layer pattern in the gap;
a semiconductor film pattern formed over the second insulating layer pattern and the first insulating layer pattern;
an impurity-doped semiconductor film pattern formed on the semiconductor film pattern, wherein the impurity-doped semiconductor film pattern contacts the top surface of the semiconductor film pattern and has an opening that extends to the semiconductor film pattern formed over the gate electrode;
a source electrode and a drain electrode each formed over a portion of the impurity doped semiconductor film pattern;
a protection film pattern formed over the source electrode and the drain electrode in a TFT area, the protection film pattern having a contact hole over the drain electrode;
a pixel electrode pattern formed on the protection film pattern and electrically connected to the drain electrode.

2. The display apparatus of claim 1, further comprising a storage line formed simultaneously with the gate electrode.

3. The display apparatus of claim 1, wherein the gate electrode comprises two metal films.

4. The display apparatus of claim 3, wherein the first metal film comprises an Al or Al-alloy.

5. The display apparatus of claim 3, wherein the second metal film comprises a refractory metal.

6. The display apparatus of claim 2, wherein the storage line overlaps a data line and the pixel electrode.

7. The display apparatus of claim 6, wherein the storage line is located between two adjacent gate lines.

8. A display apparatus, comprising:
a gate electrode;
a first insulating layer pattern formed over the gate electrode and having a gap positioned over the gate electrode, there being no first insulating layer pattern in the gap;
a second insulating layer pattern formed over the first insulating layer pattern;
a semiconductor film pattern formed over the first insulating layer pattern and over the second insulating layer pattern;
an impurity-doped semiconductor film pattern formed on the semiconductor film pattern, wherein the impurity doped semiconductor film pattern contacts the top surface of the semiconductor film pattern and has an opening that extends to the semiconductor film pattern formed over the gate electrode;
a source electrode and a drain electrode formed over a portion of the impurity-doped semiconductor film pattern;
a protection film pattern formed over the source electrode and the drain electrode in a TFT area, the protection film pattern having a contact hole over the drain electrode;
a pixel electrode pattern formed on the protection film pattern and electrically connected to the drain electrode.

9. The display apparatus of claim 8, further comprising a storage line formed simultaneously with the gate.

10. The display apparatus of claim 8, wherein the gate electrode comprises two metal films.

11. The display apparatus of claim 10, wherein the first metal film comprises an Al or Al-alloy.

12. The display apparatus of claim 10, wherein the second metal film comprises a refractory metal.

13. The display apparatus of claim 8, wherein the storage line overlaps a data line and the pixel electrode.

14. The display apparatus of claim 13, wherein the storage line is located between two adjacent gate lines.

* * * * *